(12) United States Patent
Zhang et al.

(10) Patent No.: US 12,324,306 B2
(45) Date of Patent: Jun. 3, 2025

(54) DISPLAY SUBSTRATE, FABRICATION METHOD THEREOF AND DISPLAY PANEL

(71) Applicants: Chengdu BOE Optoelectronics Technology Co., Ltd., Sichuan (CN); BOE TECHNOLOGY GROUP CO., LTD., Beijing (CN)

(72) Inventors: Yu Zhang, Beijing (CN); Zhiliang Jiang, Beijing (CN); Pan Zhao, Beijing (CN); Zhenli Zhou, Beijing (CN); Benlian Wang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 594 days.

(21) Appl. No.: 17/629,851

(22) PCT Filed: Mar. 10, 2021

(86) PCT No.: PCT/CN2021/079915
§ 371 (c)(1),
(2) Date: Jan. 25, 2022

(87) PCT Pub. No.: WO2021/218417
PCT Pub. Date: Nov. 4, 2021

(65) Prior Publication Data
US 2022/0278300 A1    Sep. 1, 2022

(30) Foreign Application Priority Data

Apr. 29, 2020  (CN) .......................... 202010358752.0

(51) Int. Cl.
*H01L 51/52*    (2006.01)
*H01L 27/32*    (2006.01)
(Continued)

(52) U.S. Cl.
CPC .......... *H10K 50/844* (2023.02); *H10K 59/131* (2023.02); *H10K 71/00* (2023.02); *H10K 59/1201* (2023.02)

(58) Field of Classification Search
CPC .... H10K 50/844; H10K 59/131; H10K 71/00; H10K 59/1201
See application file for complete search history.

(56) References Cited

U.S. PATENT DOCUMENTS 10,868,102 B1 *  12/2020  Zhang .................. H01L 23/562
2020/0075692 A1   3/2020   Park
(Continued)

FOREIGN PATENT DOCUMENTS

CN    203883009 U    10/2014
CN    106898617 A     6/2017
(Continued)

OTHER PUBLICATIONS

Li Xiong et al., CN110335961A, machine translation, Oct. 2019 (Year: 2019).*
(Continued)

*Primary Examiner* — Tracie Y Green
(74) *Attorney, Agent, or Firm* — HOUTTEMAN LAW LLC

(57) ABSTRACT

The present disclosure provides a display substrate, including: a base (1), including a display area (101) and a peripheral area (102) surrounding the display area (101); an insulating layer (2) covering the display area (101) and at least part of the peripheral area (102); at least one packaging dam (8) in the peripheral area (102) of the base (1) and around the display area (101); and an isolation structure (7) located on the base (1) at a side of the packaging dam (8) away from the display area (101). The isolation structure (8) includes a plurality of sub-structures arranged at intervals, (Continued)

an orthographic projection of the isolation structure (8) on the base (1) is around the display area (101), and the isolation structure (8) is configured to prevent a crack in the peripheral area (102) from extending to the display area (101).

14 Claims, 5 Drawing Sheets

(51) Int. Cl.
*H01L 51/56* (2006.01)
*H10K 50/844* (2023.01)
*H10K 59/131* (2023.01)
*H10K 71/00* (2023.01)
*H10K 59/12* (2023.01)

(56) References Cited

U.S. PATENT DOCUMENTS

| | | |
|---|---|---|
| 2020/0127216 A1 | 4/2020 | Tao |
| 2021/0066650 A1 | 3/2021 | Yu et al. |
| 2021/0193693 A1 | 6/2021 | Zhao et al. |
| 2021/0193960 A1 | 6/2021 | Song et al. |
| 2021/0343983 A1 | 11/2021 | Li et al. |
| 2021/0359258 A1* | 11/2021 | Guo .................. H10K 50/8426 |

FOREIGN PATENT DOCUMENTS

| | | |
|---|---|---|
| CN | 108010921 A | 5/2018 |
| CN | 108281570 A | 7/2018 |
| CN | 110120463 A | 8/2019 |
| CN | 110335961 A | 10/2019 |
| CN | 110400891 A | 11/2019 |
| CN | 110556407 A | 12/2019 |
| CN | 110970576 A | 4/2020 |
| CN | 111509021 A | 8/2020 |

OTHER PUBLICATIONS

China Patent Office, First Office Action dated Sep. 19, 2022, for corresponding Chinese application 202010358752.0.

* cited by examiner

DISPLAY SUBSTRATE, FABRICATION METHOD THEREOF AND DISPLAY PANEL

CROSS-REFERENCE TO RELATED APPLICATION

This is a National Phase Application filed under 35 U.S.C. 371 as a national stage of PCT/CN2021/079915, filed on Mar. 10, 2021, an application claiming priority from Chinese patent application No. 202010358752.0 filed on Apr. 29, 2020, the disclosure of which is incorporated herein by reference

TECHNICAL FIELD

Embodiments of the present disclosure belong to the field of display technology, and specifically relates to a display substrate, a fabrication method thereof and a display panel.

BACKGROUND

With the development of the mobile phone market, display screens are desired to be thinner, bendable, having high contrast and wide color range and the like. It is in this background that active-matrix organic light-emitting diode (AMOLED) products emerge. Although such mobile phone screens can be flexibly bent, cracks tend to generate on the display panel upon cutting, conveying and other processes during the actual production process of the mobile phone products. Some severe cracks may directly penetrate to the display area, and some cracks may be generated in the subsequent pressing fabrication process and extend to the display area.

SUMMARY

Embodiments of the present disclosure provide a display substrate, a fabrication method thereof and a display panel.

In a first aspect, an embodiment of the present disclosure provides a display substrate, including:
 a base, including a display area and a peripheral area surrounding the display area;
 an insulating layer covering the display area and at least part of the peripheral area;
 at least one packaging dam in the peripheral area of the base and around the display area; and
 an isolation structure located on the base at a side of the packaging dam away from the display area, wherein the isolation structure includes a plurality of sub-structures arranged at intervals, an orthographic projection of the isolation structure on the base is around the display area, and the isolation structure is configured to prevent a crack in the peripheral area from extending to the display area.

In some embodiments, each of the plurality of sub-structures includes a groove in the base.

In some embodiments, each of the plurality of sub-structures includes a protrusion on the base.

In some embodiments, the base includes a first sub-layer, a second sub-layer and a third sub-layer stacked in sequence, and the insulating layer is on the third sub-layer and includes a plurality of sub-film layers stacked on one another; and
 the grooves are in the third sub-layer at a side of the third sub-layer close to the insulating layer, and are sequentially arranged in a direction away from the display area.

In some embodiments, each groove has a depth less than a thickness of the third sub-layer.

In some embodiments, the insulating layer is discontinuously disposed in the grooves within an arrangement area of the grooves.

In some embodiments, the isolation structure further includes a cladding layer on the base and covering the arrangement area of the grooves.

In some embodiments, in the direction away from the display area, the cladding layer further covers a section of the insulating layer on at least one side of the arrangement area of the grooves.

In some embodiments, an orthographic projection of the insulating layer on the base covers the peripheral area between the packaging dam and the isolation structure; and
 the protrusions include a plurality of first protrusions sequentially arranged along a direction away from the display area.

In some embodiments, one of the plurality of first protrusions close to the insulating layer covers a section of the insulating layer.

In some embodiments, a same distance, which is in a range of 5 to 7 μm, is provided between any two adjacent first protrusions.

In some embodiments, in the direction away from the display area, the plurality of first protrusions has a total arrangement width in a range of 50 to 70 μm.

In some embodiments, the protrusions further include a plurality of second protrusions at a side of the insulating layer away from the base and at a side of the packaging dam away from the display area and the plurality of second protrusions are close to the section of the insulating layer, and are sequentially arranged in the direction away from the display area.

In some embodiments, the first sub-layer and the third sub-layer are both made of an organic resin material, and the second sub-layer is made of an inorganic insulating material; and each of the plurality of sub-film layers is made of an inorganic insulating material.

In some embodiments, the peripheral area includes a pad area configured to provide a signal wiring and a wire bonding terminal, the pad area is on an edge of a side of the base, and the isolation structure is on an edge of the base other than the edge where the pad area is located.

In a second aspect, an embodiment of the present disclosure provides a display panel, including the display substrate as described above.

In a third aspect, an embodiment of the present disclosure provides a method for fabricating a display substrate including a base having a display area and a peripheral area surrounding the display area. The method includes:
 fabricating a base;
 fabricating an insulating layer on the base; the insulating layer covering the display area and at least part of the peripheral area;
 fabricating at least one packaging dam in the peripheral area of the base and around the display area; and
 fabricating an isolation structure located on the base of the packaging dam away from the display area, wherein fabricating the isolation structure includes fabricating a plurality of sub-structures arranged at intervals, wherein an orthographic projection of the isolation structure on the base is around the display area, and the isolation structure is configured to prevent a crack in the peripheral area from extending to the display area.

BRIEF DESCRIPTION OF DRAWINGS

Accompanying drawings are provided for further understanding of the embodiments of the present disclosure and constitute a part of the specification. Hereinafter, these drawings are intended to explain the disclosure together with the following embodiments, but should not be considered as a limitation to the disclosure. The above and other features and advantages will become more apparent to those skilled in the art through detailed description of the exemplary embodiments with reference to the accompanying drawings, in which.

DETAIL DESCRIPTION OF EMBODIMENTS

Figure 1:
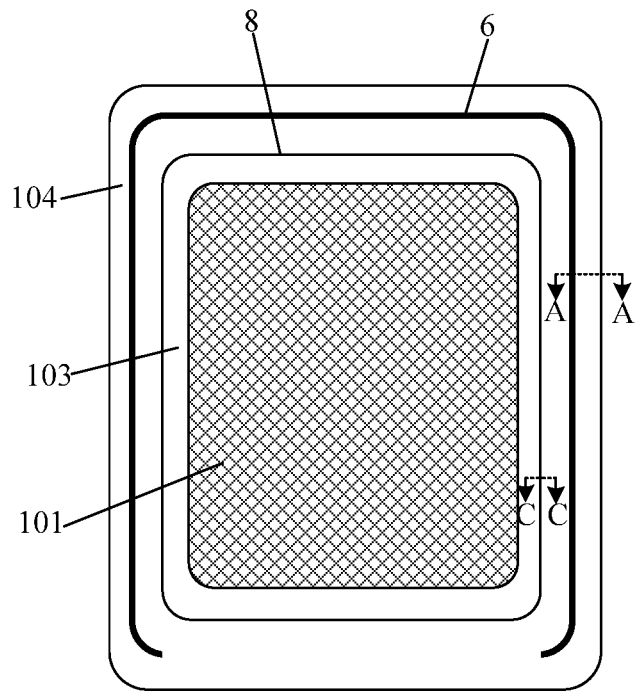
FIG. 1 is a structural top view of an AMOLED display substrate.

In order to make those skilled in the art better understand the technical solutions in the embodiments of the present disclosure, the display substrate, the fabrication method thereof and the display panel provided in the embodiments of the present disclosure are described in further detail below with reference to the accompanying drawings and specific embodiments.

Embodiments of the present disclosure will be described more sufficiently below with reference to the accompanying drawings, but which may be embodied in different forms and should not be construed as limited to the embodiments set forth in the disclosure. Rather, these embodiments are provided so that this disclosure will be thorough and complete, and will fully convey the scope of the disclosure to those skilled in the art.

The embodiments of the present disclosure are not limited to the embodiments shown in the drawings, but include modifications of configurations formed based on a manufacturing process. Thus, the areas illustrated in the figures have schematic properties, and the shapes of the areas shown in the figures exemplarily illustrate specific shapes of the areas, but are not intended to be limiting.

The AMOLED product adopts the organic self-luminous display technology, and the light-emitting material is highly sensitive to water and oxygen. The water and oxygen will be transferred to the display area along the crack extending path, and finally lead to black spots on the screen, seriously affecting the quality of the product. How to prevent extension of the cracks at edge has become an important subject for the AMOLED mobile phone screen designers, and has important practical significance.

Figure 2:
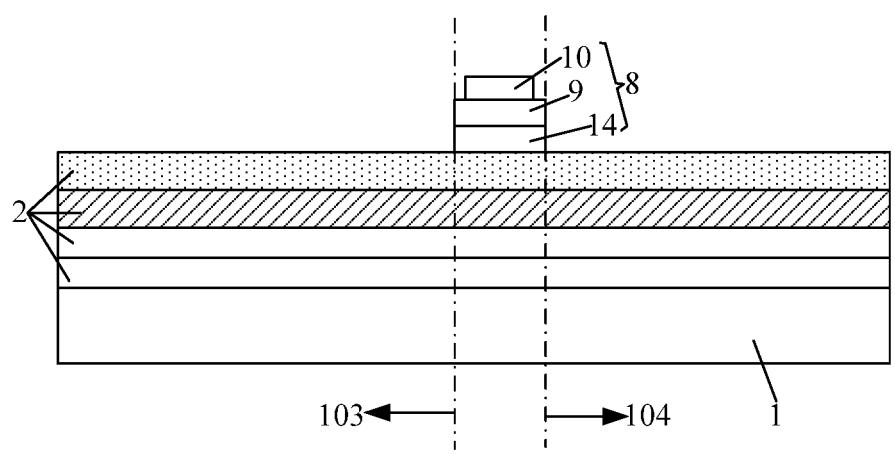
FIG. 2 is a structural sectional view of the AMOLED display substrate in FIG. 1 taken along line CC.
Figure 3:
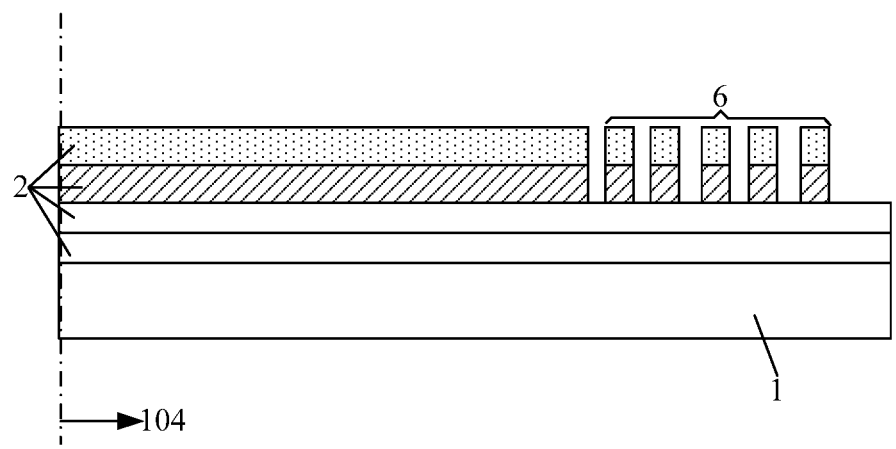
FIG. 3 is a structural sectional view of the AMOLED display substrate in FIG. 1 taken along line AA.

As shown in FIGS. 1 to 3, an AMOLED display substrate (also referred to as an array substrate) includes a display area 101, and a first edge area 103 and a second edge area 104 sequentially disposed around the display area 101. The first edge area 103 and the second edge area 104 are defined by a packaging dam 8. The packaging dam 8 is disposed around a periphery of the display area 101 in an enclosed manner, and is typically formed by the same fabrication process as at least one or two or more film layers formed on the display area 101, such as a pixel defining layer 9, a spacer layer 10, a planarization layer 14, and the like. The packaging dam 8, which is composed by one such film layer or by two or more such film layers stacked on one another, is to prevent an organic film material in the packaging film layer from overflowing during inkjet printing. The first edge area 103 is an edge area that is closer to the display area 101 than the second area, and is provided with circuit wirings configured to provide electrical signals for lighting light-emitting devices in the display area 101. The second edge area 104 is an edge area that is farther away from the display area 101 than the first edge area 103. The second edge area 104 is typically not provided with any circuit wiring, but provided with an insulating film layer which is prepared and formed in one-step process with the insulating film layer in the display area 101, such as a base, or other insulating film layers disposed on the base. The second edge area 104 is used for press-fitting installation of a subsequent protective film layer, an outer bezel, or the like of the AMOLED display substrate. A side of the second edge area 104 away from the display area 101 is an edge of the display panel.

In the packaging of the AMOLED display substrate, the packaging film layer only covers and packages the display area and the first edge area, while the second edge area is exposed to facilitate subsequent press-fitting installation of other film layers or an outer bezel.

During production and transportation of the AMOLED display substrate, an edge of the AMOLED display substrate tends to experience collisions to cause cracks in the brittle insulating film layer (such as an inorganic insulating layer) in the second edge area, and the cracks may easily extend through the insulating film layer to the display area, causing corrosion of the light-emitting material in the display area by water and oxygen, and degrading the quality of the AMOLED display substrate.

In the related art, partition 6 is generally formed in a portion of the insulating layers 2 in the second edge area 104 on the base 1. That is, the partitions 6 at intervals are formed by etching a portion of the insulating layer 2, to alleviate extending of the cracks from the second edge area 104 to the display area. However, since the insulating layer 2 is brittle, it is still impossible to avoid cracks and crack extension in other portions of the insulating layer 2 in the second edge area 104 and the insulating layer 2 in the first edge area 103 even if the partitions 6 are formed in a portion of the insulating layer 2 in the second edge area 104.

Aiming at the problem that the quality of the product is affected when the cracks at edge extend to the display area, embodiments of the present disclosure provide a display substrate, a fabrication method thereof and a display panel.

Figure 4:
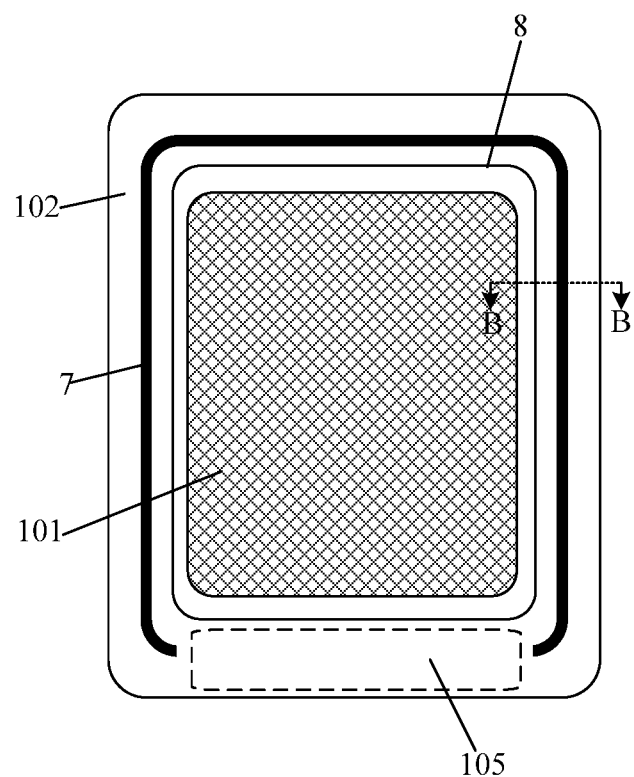
FIG. 4 is a structural top view of a display substrate according to an embodiment of the present disclosure.
Figure 5:
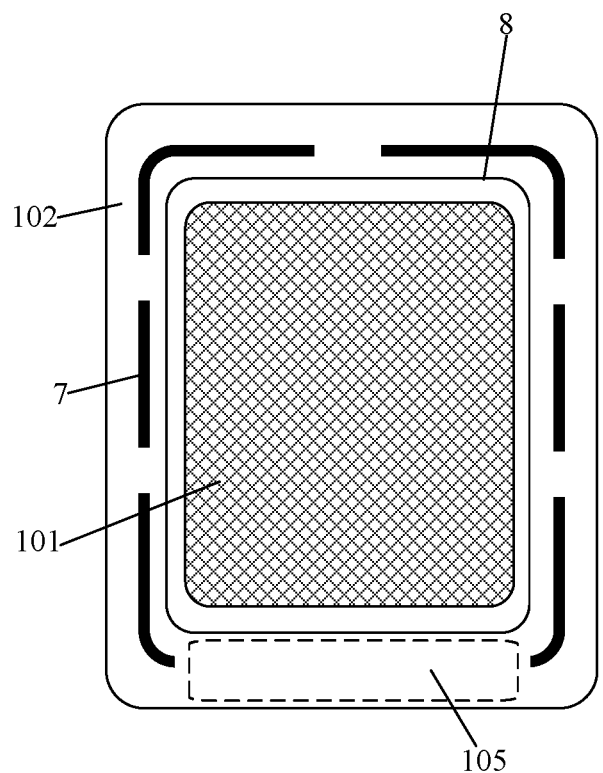
FIG. 5 is a structural top view of another display substrate according to an embodiment of the present disclosure.
Figure 6:
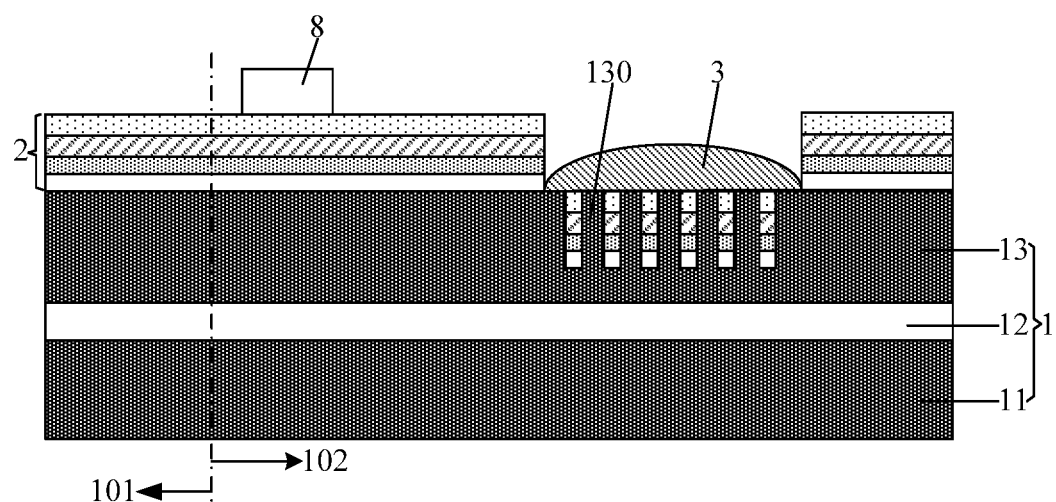
FIG. 6 is a structural sectional view of the display substrate in FIG. 4 taken along line BB.

In a first aspect, an embodiment of the present disclosure provides a display substrate which, as shown in FIGS. 4 to 6, includes a base 1, including a display area 101, and a peripheral area 102 surrounding the display area 101; an insulating layer 2 covering the display area 101 and at least part of the peripheral area 102; at least one packaging dam 8 located in the peripheral area 102 of the base 1 and provided around the display area 101; and an isolation structure 7 located on the base 1 at a side of the packaging dam 8 away from the display area 101. The isolation structure 7 includes a plurality of sub-structures arranged at intervals. An orthographic projection of the isolation structure 7 on the base 1 is arranged around the display area 101, and the isolation structure 7 is configured to prevent a crack in the peripheral area 102 from extending to the display area 101.

The insulating layer 2 typically includes a plurality of inorganic insulating layers stacked on one another. However, the insulating layer 2 may also be a structure in which inorganic insulating layers and organic insulating layers are stacked on one another. The inorganic insulating layer may be easily broken upon collisions. The packaging dam 8 is disposed around the display area 101 in an enclosed manner. In this embodiment, one packaging dam 8 is provided, but it is also possible to provide two or more packaging dams 8.

In some embodiments, the peripheral area 102 includes a pad area 105 configured to provide signal wirings and a wire bonding terminal. The pad area 105 is located on an edge at one side of the base 1, and the isolation structure 7 is located on an edge of the base 1 at another side other than the side where the pad area 105 is located. That is, for example, if the display substrate has four sides, the isolation structure 7 may be disposed in the peripheral area 102 at only three sides of the display substrate, and the peripheral area 102 on the last side of the display substrate without the isolation structure 7 is provided with other structures. In this way, the peripheral area 102 at one side of the display substrate is not provided with the isolation structure 7. It should be noted that the isolation structure 7 may also be provided on the pad area 105 side. For example, the isolation structure provided on the pad area 105 side and the isolation structure 7 provided in the peripheral area 102 at the other three sides of the display substrate may form a closed ring. A separate isolation structure 7 may be provided on the pad area 105 side. That is, the separate isolation structure 7 is independent from the isolation structure 7 in the peripheral area 102 at the other three sides of the display substrate. In addition, the isolation structure 7 may be distributed continuously (as shown in FIG. 4) or discontinuously (as shown in FIG. 5) in the peripheral area 102 at the three sides of the display substrate.

By providing the isolation structure 7 on the base 1 on the display substrate, at a side of the packaging dam 8 away from display area 101, upon an impact on the peripheral area 102 of the display substrate, the isolation structure 7 can absorb the impact energy and buffer the impact force so that the impact resistance of the display substrate is improved, generation of the cracks in the film layers is avoided and the extending path of the cracks in the film layers is blocked, and cracks at edge are prevented from being transferred to the display area 101, thereby preventing invasion of external water and oxygen through the cracks to the display area 101 as well as poor reliability of the display substrate, and thus ensuring the quality of the display substrate.

In some embodiments, each of the sub-structures includes a groove formed in the base 1.

In some embodiments, the base 1 includes a first sub-layer 11, a second sub-layer 12 and a third sub-layer 13 stacked in sequence. The insulating layer 2 is located on the third sub-layer 13 and includes a plurality of sub-film layers stacked on one another. The grooves are formed in the third sub-layer 13 at a side of the third sub-layer 13 close to the insulating layer 2, and are sequentially arranged in a direction away from the display area 101. The first sub-layer 11 and the third sub-layer 13 are both made of an organic resin material, and the second sub-layer 12 is made of an inorganic insulating material. Each of the sub-film layers is made of an inorganic insulating material. With such arrangement, a partition 130 is formed between adjacent grooves. The third sub-layer 13 is flexible to some extent since it is made of an organic resin material. By providing the partition 130 in the third sub-layer 13, upon an impact on the peripheral area 102 of the display substrate, the partition 130 can absorb the impact energy and buffer the impact force so that the impact resistance of the display substrate is improved.

In some embodiments, each groove has a depth less than a thickness of the third sub-layer 13. That is, the groove in the third sub-layer 13 does not penetrate through the thickness of the third sub-layer 13. With such arrangement, cracks are prevented from being generated in the second sub-layer 12 of the inorganic insulating material upon collisions, thereby preventing invasion of external water and oxygen through the cracks in the second sub-layer 12 to the display area 101 as well as poor reliability of the display substrate, and thus ensuring the quality of the display substrate.

It should be noted that the plurality of partitions 130 may have the same height, or may have different heights.

In some embodiments, the insulating layer 2 is discontinuously disposed in the grooves within an arrangement area of the grooves. By providing the insulating layer 2 in the grooves, the strength of the arrangement area of the partition walls 130 can be increased, and the impact resistance of the peripheral area 102 can be enhanced. By providing the insulating layer 2 discontinuously in the grooves within the arrangement area of the grooves, and by alternating the discontinuous insulating layer 2 and the grooves, cracks generated upon impact on the peripheral area 102 of the display substrate are prevented from extending along the insulating layer 2, thereby avoiding poor reliability of the display substrate.

In some embodiments, the isolation structure 7 further includes a cladding layer 3 disposed on the base 1 and covering the arrangement area of the grooves. The cladding layer 3 is made of an organic resin material. By providing the cladding layer 3 covering the arrangement area of the partitions 130 (or the arrangement area of the grooves), not only the strength of the arrangement area of the partitions 130 and the impact resistance of the peripheral area 102 can be further improved, but also the capability of preventing water and oxygen of the arrangement area of the partitions 130 from invading can further enhanced.

Figure 7:
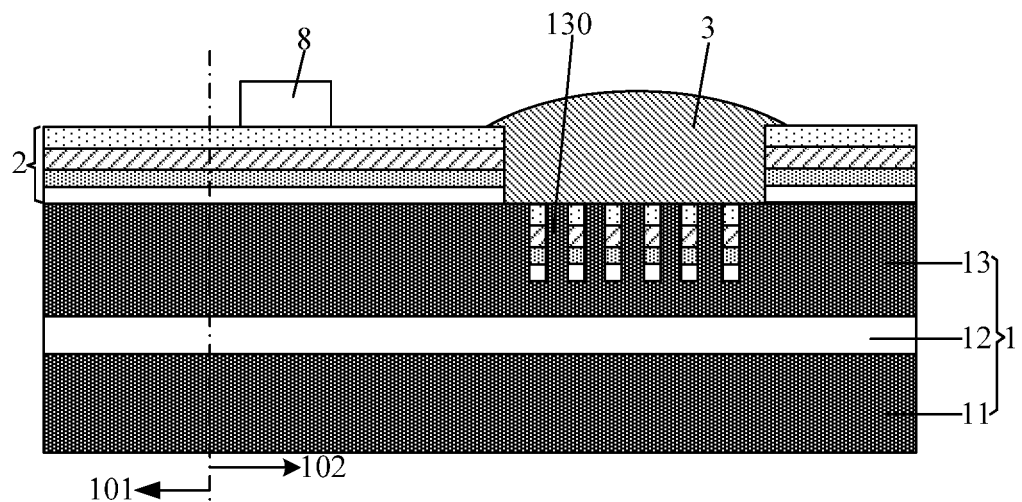
FIG. 7 is another structural sectional view of the display substrate in FIG. 4 taken along line BB.

In some embodiments, as shown in FIG. 7, in the direction away from the display area 101, the cladding layer 3 further covers a section of the insulating layer 2 on at least one side of the arrangement area of the grooves. The cladding layer 3 covers a section of the insulating layer 2 on two sides of the arrangement area of the partitions 130. A residual conductive metal film layer will generally occur on the section of the insulating layer 2 on the two sides of the arrangement area of the partitions 130. The residual conductive metal film layer is exposed to the outside and may be easily corroded by external water and oxygen to form black spots. As a result, there may be black spots in the peripheral area 102 of the display substrate, which affects an aesthetic degree of the display substrate. By providing the cladding layer 3 covering the section of the insulating layer 2 on two sides of the arrangement area of the grooves, the residual conductive metal film layer on the section of the insulating layer 2 is prevented from being exposed to the outside and corroded by external water and oxygen, thereby avoiding the black spots in the peripheral area 102 of the display substrate.

Organic light-emitting devices (i.e., OLED devices) are further formed in the display area 101 of the display substrate to implement organic electroluminescent display of the display substrate.

Based on the above structure of the display substrate, an embodiment the present disclosure further provides a method for fabricating a display substrate including a base having a display area and a peripheral area surrounding the display area. The method includes:

fabricating a base;

fabricating an insulating layer on the base; the insulating layer covering the display area and at least part of the peripheral area;

fabricating at least one packaging dam located in the peripheral area of the base and provided around the display area; and fabricating an isolation structure located on the base at a side of the packaging dam away from the display area. The fabricating the isolation structure includes fabricating a plurality of sub-structures arranged at intervals. An orthographic projection of the isolation structure on the base is arranged around the display area, and the isolation structure is configured to prevent a crack in the peripheral area from extending to the display area.

The specific process for fabricating the display substrate includes the following steps S1 to S4.

Step S1 includes fabricating the first sub-layer, the second sub-layer and the third sub-layer in sequence.

Step S2 includes forming grooves in the third sub-layer of the peripheral area.

In this step, the grooves in the third sub-layer are formed by exposure and development.

Step S3 includes fabricating an insulating layer by a patterning process, removing a portion of the insulating layer corresponding to partitions by dry etching, and retaining a portion of the insulating layer in the grooves.

In the step, the patterning process includes film forming, photoresist coating, exposure, development, etching or other steps.

Step S4 includes fabricating a cladding layer.

In this step, the cladding layer is formed by coating, exposure, and development.

Figure 8:
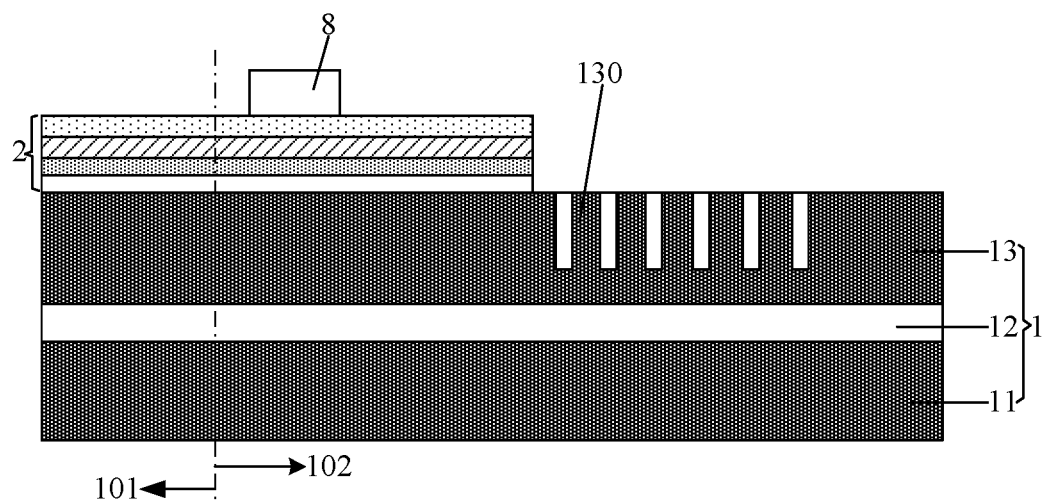
FIG. 8 is yet another structural sectional view of the display substrate in FIG. 4 taken along line BB.

An embodiment of the present disclosure provides a display substrate which differs from the above embodiments in that, as shown in FIG. 8, the insulating layer 2 is not provided in the arrangement area of the grooves. A partition 130 is formed between adjacent grooves.

In some embodiments, the insulating layer 2 is not provided in the arrangement area of the partitions 130 or in the peripheral area 102 at a side of the arrangement area of the partitions 130 away from the packaging dam 8.

In this embodiment, the isolation structure includes only the grooves formed in the third sub-layer 13, and the cladding layer is not provided in the arrangement area of the grooves.

By not providing the insulating layer 2 in the arrangement area of the isolation structure, it also achieves the effect that cracks generated upon impact on the peripheral area 102 of the display substrate are prevented from extending along the insulating layer 2, thereby avoiding poor reliability of the display substrate. By providing the isolation structure on the base 1 of the display substrate at a side of the packaging dam away from display area 101, upon an impact on the peripheral area 102 of the display substrate, the isolation structure can absorb the impact energy and buffer the impact force so that the impact resistance of the display substrate is improved, generation of the cracks in the film layers are avoided and the extending path of the cracks in the film layers is blocked, and cracks at edge are prevented from being transferred to the display area 101, thereby preventing invasion of external water and oxygen through the cracks to the display area 101 as well as poor reliability of the display substrate, and thus ensuring the quality of the display substrate.

Other structures of the display substrate in this embodiment are the same as those in the above embodiments, and thus are not repeated here.

Based on the structure of the display substrate in the embodiments of the present disclosure, an embodiment the present disclosure further provides a method for fabricating a display substrate, which differs from the method in the above embodiment in that the insulating layer is not provided in the arrangement area of the isolation structure.

The specific process for fabricating the display substrate includes the following steps S1 to S4.

Step S1 includes fabricating the first sub-layer, the second sub-layer and the third sub-layer in sequence.

Step S2 includes forming grooves in the third sub-layer of the peripheral area.

In this step, the grooves in the third sub-layer are formed by exposure and development.

Step S3 includes fabricating an insulating layer by patterning process, removing portions of the insulating layer corresponding to the arrangement area of the grooves and the peripheral area at a side of the arrangement area of the grooves away from the packaging dam by dry etching.

In this step, the patterning process includes film forming, photoresist coating, exposure, development, etching or other steps.

Figure 9:
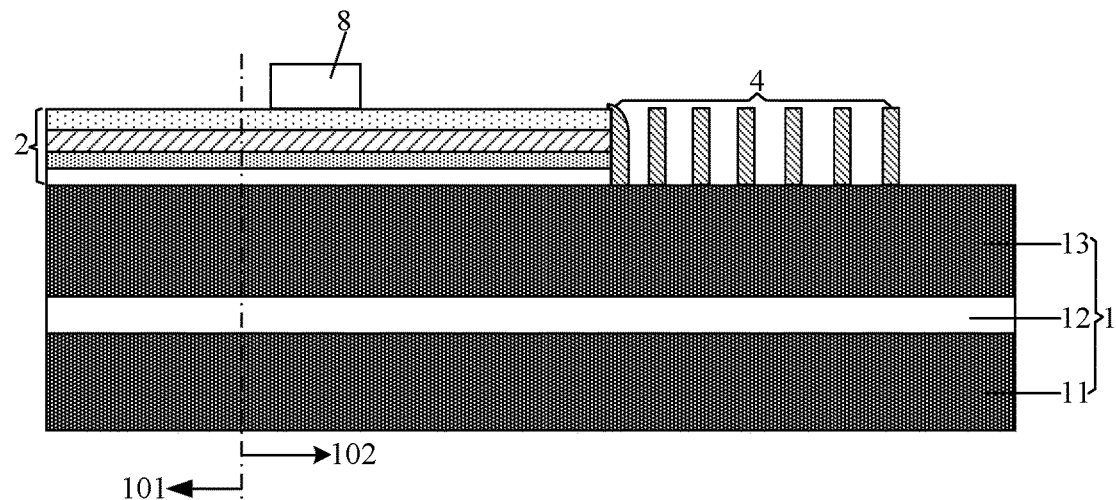
FIG. 9 is yet another structural sectional view of the display substrate in FIG. 4 taken along line BB.

In an embodiment of the present disclosure, there is provided a display substrate which differs from the above embodiments in that, as shown in FIG. 9, the sub-structures includes a protrusion disposed on the base 1.

In some embodiments, an orthographic projection of the insulating layer 2 on the base 1 covers the peripheral area 102 between the packaging dam 8 and the isolation structure; and the protrusion includes a plurality of first protrusions 4 which are sequentially arranged along a direction away from the display area 101. That is, the insulating layer 2 is not provided in the arrangement area of the first protrusions 4.

Thereby, upon impact on the peripheral area 102 of the display substrate at a side of the packaging dam 8 away from the display area 101, the first protrusions 4 can absorb the impact energy and buffer the impact force so that cracks in the insulating layer 2 of the peripheral area 102 caused by the impact are avoided, and the quality of the display substrate is ensured.

In some embodiments, one of the first protrusions 4 close to the insulating layer 2 covers a section of the insulating layer 2. A residual conductive metal film layer will generally occur on the section of the insulating layer 2 in the peripheral area 102. The residual conductive metal film layer is exposed to the outside and may be easily corroded by external water and oxygen to form black spots. As a result, there may be black spots in the peripheral area 102 of the display substrate, which affects an aesthetic degree of the display substrate. By providing the first protrusions 4 covering the section of the insulating layer 2 in the peripheral area 102, the residual conductive metal film layer on the section of the insulating layer 2 is prevented from being exposed to the outside and corroded by external water and oxygen, thereby avoiding the black spots in the peripheral area 102 of the display substrate.

In some embodiments, the same distance, which is in the range of 5 to 7 µm, is provided between any two adjacent first protrusions 4. The first protrusions 4 may have the same height, or may have different heights. For example, a distance of 6 µm is provided between the adjacent first protrusions 4. With such a distance range, the first protrusions 4 are enabled to well absorb the impact energy, thereby avoiding cracks in the insulating layer 2 caused by the impact.

In some embodiments, in the direction away from the display area 101, the plurality of first protrusions 4 has a total arrangement width in the range of 50 to 70 µm. With such a total arrangement width range, the first protrusions 4 are enabled to well absorb the impact energy, thereby avoiding cracks in the insulating layer 2 caused by the impact.

Figure 10:
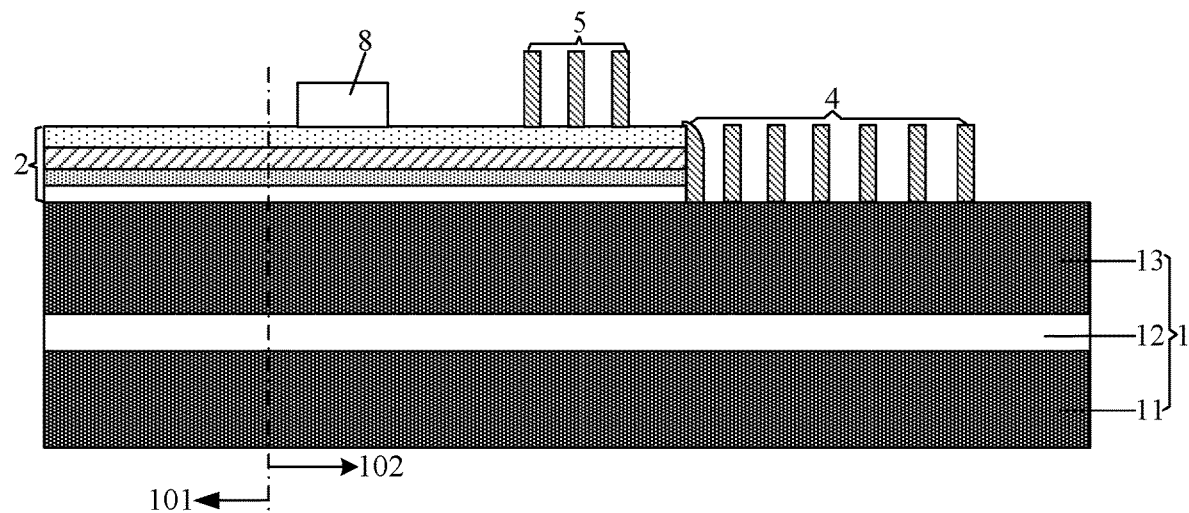
FIG. 10 is yet another structural sectional view of the display substrate in FIG. 4 taken along line BB.

In some embodiments, as shown in FIG. 10, the protrusion further includes a plurality of second protrusions 5 disposed at a side of the insulating layer 2 away from the base 1, and at a side of the packaging dam 8 away from the display area 101, and the second protrusions 5 are distributed near the section of the insulating layer 2, and are sequentially arranged in the direction away from the display area 101. By providing the second protrusions 5, the impact energy can be absorbed and the impact force can be buffered, thereby further avoiding cracks in the insulating layer 2 of the peripheral area 102 caused by the impact, and ensuring the quality of the display substrate.

The number and the total arrangement width range of the second protrusions 5, and the distance between adjacent second protrusions 5 are not limited herein, and the second protrusions 5 may have the same height, or may have different heights, as long as the second protrusions 5 can absorb the impact energy and buffer the impact force.

In some embodiments, the first protrusions 4 and the second protrusions 5 are both made of an organic resin material. The organic resin material is flexible to some extent, and can well absorb the impact energy and buffer the impact force.

Other structures of the display substrate in this embodiment are the same as those in the above embodiments, and thus are not repeated here.

Based on the above structure of the display substrate, an embodiment of the present disclosure further provides a method for fabricating a display substrate, which differs from the method in the above embodiments in the specific fabrication process of the display substrate.

The specific process for fabricating the display substrate includes the following steps S1 to S4.

Step S1 includes fabricating the first sub-layer, the second sub-layer and the third sub-layer in sequence.

Step S2 includes fabricating an insulating layer by patterning process, removing a portion of the insulating layer corresponding to the isolation structure formed in the peripheral area, at a side of the insulating layer away from the packaging dam by dry etching.

In this step, the patterning process includes film forming, photoresist coating, exposure, development, etching or other steps.

Step S3 includes fabricating first protrusions and second protrusions.

In this step, the patterns of the first protrusions and the second protrusions are formed by coating, exposing and developing the film layer.

In the display substrate provided in the above embodiments of the present disclosure, by providing the isolation structure on the base of the display substrate at a side of the packaging dam away from display area, upon an impact on the peripheral area of the display substrate, the isolation structure can absorb the impact energy and buffer the impact force so that the impact resistance of the display substrate is improved, generation of the cracks in the film layers are avoided and the extending path of the cracks in the film layers is blocked, and cracks at edge are prevented from being transferred to the display area, thereby preventing invasion of external water and oxygen through the cracks to the display area as well as poor reliability of the display substrate, and thus ensuring the quality of the display substrate.

In a second aspect, an embodiment of the present disclosure further provides a display panel, including a display substrate provided in any of the above embodiments.

In some embodiments, the display panel further includes a package layer assembled with the display substrate and covering the display area of the display substrate. The flexible isolation structure in the display substrate is exposed.

By adopting the display substrate provided in any of the above embodiments, poor reliability of the display panel is improved, and the quality of the display panel is ensured.

The display panel provided in the embodiment of the present disclosure may be any product or component with a display function, such as an OLED panel, an OLED television, a monitor, a mobile phone, a navigator, or the like.

It will be appreciated that the above implementations are merely exemplary implementations for the purpose of illustrating the principle of the present disclosure, and the present disclosure is not limited thereto. Various modifications and improvements can be made by a person having ordinary skill in the art without departing from the protection scope of the disclosure defined in the accompany claims, and accordingly, all of these modifications and improvements fall within the protection scope of the present disclosure.

What is claimed is:

1. A display substrate, comprising:
   a base, comprising a display area and a peripheral area surrounding the display area;
   an insulating layer covering the display area and at least part of the peripheral area;
   at least one packaging dam in the peripheral area of the base and around the display area; and
   an isolation structure on the base at a side of the packaging dam away from the display area, wherein the isolation structure comprises a plurality of sub-structures arranged at intervals, an orthographic projection of the isolation structure on the base is around the display area, and the isolation structure is configured to prevent a crack in the peripheral area from extending to the display area,
   wherein the plurality of sub-structures comprises protrusions on the base;
   the protrusions comprise a plurality of first protrusions sequentially arranged along a direction away from the display area and a plurality of second protrusions at a side of the insulating layer away from the base and at a side of the packaging dam away from the display area, and the plurality of second protrusions are close to the section of the insulating layer, and are sequentially arranged in the direction away from the display area, and
   wherein the plurality of first protrusions and the plurality of second protrusions are made of an organic resin material.

2. The display substrate according to claim 1, wherein each of the plurality of sub-structures comprises a groove in the base.

3. The display substrate according to claim 2, wherein the base comprises a first sub-layer, a second sub-layer and a third sub-layer stacked in sequence, and the insulating layer is on the third sub-layer and comprises a plurality of sub-film layers stacked on one another; and the grooves are in the third sub-layer at a side of the third sub-layer close to the insulating layer, and are sequentially arranged in a direction away from the display area.

4. The display substrate according to claim 3, wherein each groove has a depth less than a thickness of the third sub-layer.

5. The display substrate according to claim 3, wherein the insulating layer is discontinuously disposed in the grooves within an arrangement area of the grooves.

6. The display substrate according to claim 5, wherein the isolation structure further comprises a cladding layer on the base and covering the arrangement area of the grooves.

7. The display substrate according to claim 6, wherein in the direction away from the display area, the cladding layer further covers a section of the insulating layer on at least one side of the arrangement area of the grooves.

8. The display substrate according to claim 1, wherein an orthographic projection of the insulating layer on the base covers the peripheral area between the packaging dam and the isolation structure.

9. The display substrate according to claim 8, wherein a same distance, which is in a range of 5 to 7 μm, is provided between any two adjacent first protrusions.

10. The display substrate according to claim 8, wherein in the direction away from the display area, the plurality of first protrusions has a total arrangement width in a range of 50 to 70 μm.

11. The display substrate according to claim 3, wherein the first sub-layer and the third sub-layer are both made of an organic resin material, and the second sub-layer is made of an inorganic insulating material; and each of the plurality of sub-film layers is made of an inorganic insulating material.

12. The display substrate according to claim 1, wherein the peripheral area comprises a pad area configured to provide a signal wiring and a wire bonding terminal, the pad area is on an edge of a side of the base, and the isolation structure is on an edge of the base other than the edge where the pad area is located.

13. A display panel, comprising a display substrate according to claim 1.

14. A method for fabricating a display substrate comprising a base having a display area and a peripheral area surrounding the display area, the method comprising:

fabricating a base;

fabricating an insulating layer on the base; the insulating layer covering the display area and at least part of the peripheral area;

fabricating at least one packaging dam in the peripheral area of the base and around the display area; and fabricating an isolation structure on the base at a side of the packaging dam away from the display area, wherein the fabricating the isolation structure comprises fabricating a plurality of sub-structures arranged at intervals, wherein an orthographic projection of the isolation structure on the base is around the display area, and the isolation structure is configured to prevent a crack in the peripheral area from extending to the display area, wherein the plurality of sub-structures comprises protrusions on the base;

the protrusions comprise a plurality of first protrusions sequentially arranged along a direction away from the display area and a plurality of second protrusions at a side of the insulating layer away from the base and at a side of the packaging dam away from the display area, and the plurality of second protrusions are close to the section of the insulating layer, and are sequentially arranged in the direction away from the display area, and wherein the plurality of first protrusions and the plurality of second protrusions are made of an organic resin material.

* * * * *